(12) United States Patent
Haq

(10) Patent No.: US 6,237,771 B1
(45) Date of Patent: May 29, 2001

(54) WAFER SHIPPING CONTAINER

(76) Inventor: Noor Ul Haq, 21450 Mt. Eden Ct., Saratoga, CA (US) 95070-5302

( * ) Notice: Subject to any disclaimer, the term of this patent is extended or adjusted under 35 U.S.C. 154(b) by 0 days.

(21) Appl. No.: 09/473,918

(22) Filed: Dec. 28, 1999

(51) Int. Cl.$^7$ ................................................. B65D 85/48
(52) U.S. Cl. ......................... 206/454; 206/303; 206/710; 211/41.18
(58) Field of Search ................................... 206/454, 710, 206/1.5, 449, 303, 403, 404; 220/290, 297, 300; 211/41.18, 41.19; 118/500

(56) References Cited

U.S. PATENT DOCUMENTS

| | | | | |
|---|---|---|---|---|
| 1,444,135 | * | 2/1923 | O'connor | 220/293 |
| 3,854,582 | * | 12/1974 | Martinelli | 206/508 |
| 4,333,580 | * | 6/1982 | Sweigart, Jr. | 220/300 |
| 4,705,163 | * | 11/1987 | James | 220/293 |
| 4,723,686 | * | 2/1988 | Pennisi | 220/300 |

* cited by examiner

*Primary Examiner*—Paul T. Sewell
*Assistant Examiner*—Shian Luong
(74) *Attorney, Agent, or Firm*—The Kline Law Firm

(57) ABSTRACT

A wafer shipping container includes two sections, an upper section and a lower section. The container sections will both typically be formed from molded plastic. One of the container sections includes projections that are received in apertures in the other container section. The projections have tabs on their ends to secure the projections in the apertures. The top section of the container is secured to the bottom section of the container by inserting the projections into the apertures, then rotating one section with respect to the other section so as to actuate a locking mechanism. The locking mechanism ensures that the two sections of the container will not accidentally become separated during shipping, or at any time before the user wishes to open the container.

4 Claims, 2 Drawing Sheets

WAFER SHIPPING CONTAINER

FIELD OF THE INVENTION

The present invention relates generally to shipping containers, and more particularly is a shipping container specifically adapted to accommodate silicon wafers, particularly wafers that have been ground, lapped, or polished.

BACKGROUND OF THE INVENTION

Semiconductor wafer manufacturing technology utilizes very sophisticated wafer processing procedures and complicated manufacturing systems to produce semiconductor wafers. Each wafer goes through several process steps such as resist spinning, etching, dielectric layer depositions, metal depositions, and different encapsulation layer processes. These process steps are performed to define and etch pre-designed patterns onto the silicon wafers. The wafers are subjected to several high temperature processes, with temperatures ranging from 400° C. to 1400° C. It is during these multiple processing and deposition processes involving multiple layers of different types of metals and dielectric that a great deal of stress is built up in the layers on the wafer. The stress is generated due to differences in coefficients of expansion of the individual layers that are in direct contact with each other.

The ever-increasing demand for reduced product sizes and miniaturization of computers has forced semiconductor manufacturers to shrink all the parts that go into electronic products. Common examples of reduced-size products are laptop computers, notebook computers, mobile telephones, etc. In order to manufacture these products, manufacturers have to make smaller displays and keyboards, and to produce thinner PC Boards. Manufacturers must also reduce the thickness of assembled IC packages so as to satisfy the miniaturization parameters.

In order to meet the challenges of Thin Small Outline Packages (TSOP), semiconductor manufacturers have been forced to reduce the thickness of silicon wafers before sawing and dicing operations. Historically, these wafers were shipped overseas to assembly houses or locally to subcontractors for sawing and assembly operations. The wafer thickness ranged from 30 mils for 200-mm diameter wafers to 22 mils for 100-mm diameter wafers. These thickness ranges allowed manufacturers to ship wafers in plastic containers, commonly referred to as "jelly jars". The most commonly used containers were round with a lid which could be screwed onto the top. Wafers were placed in these jars with foam cushions on the bottom and on top. The wafers were separated and protected by sheets of thin cleanroom paper, or TYVEK (a product manufactured by DuPont Company).

Most manufacturers find it very difficult to package wafers in the plastic jars. Placing wafers in these plastic containers has always been a manual operation, which is very time consuming and labor intensive. In addition, when the subcontractors received wafers packed in the plastic containers, the subcontractors would have to remove the top lid and flip over the jar to remove the silicon wafers. This method was very cumbersome, and subjected the wafers to an unacceptably high risk of damage.

The packaging and shipping of wafers for further processing becomes even more critical when wafers are shipped after processes which reduce the overall thickness of the wafer, such as a Wafer Grinding Operation. Ground wafers, whose thicknesses range from about 10 mils for 200 mm wafers to about 4 mils for 100 mm, are very thin and fragile, and can easily be broken during packaging, shipping, or unpacking.

Accordingly, it is an object of the present invention to provide a shipping container that is suited to shipping wafers that have been ground to a very small thickness.

It is a further object of the present invention to provide a wafer shipping container that can be loaded and unloaded with vacuum wands or tweezers without breaking wafers.

It is a still further object of the present invention to provide a wafer shipping container that can be used in automated wafer transferring systems.

It is still another object of the invention to provide wafer shipping containers that can be stacked on top of each other so as to reduce shipping costs.

SUMMARY OF THE INVENTION

The present invention is a wafer shipping container that comprises two sections, an upper section and a lower section. The container sections will both typically be formed from molded plastic. One of the container sections includes projections that are received in apertures in the other container section. The projections have tabs on their ends to secure the projections in the apertures. The top section of the container is secured to the bottom section of the container by inserting the projections into the apertures, then rotating one section with respect to the other section so as to actuate a locking mechanism. The locking mechanism ensures that the two sections of the container will not accidentally become separated during shipping, or at any time before the user wishes to open the container.

An advantage of the present invention is that it provides a more secure shipping means for wafers than is available in the prior art.

Another advantage of the present invention is that the container can be loaded and unloaded with vacuum wands, tweezers, or automated systems without undue breakage of the wafers.

A still further advantage of the present invention is that the containers can be stacked on top of each other so as to reduce shipping costs.

These and other objects and advantages of the present invention will become apparent to those skilled in the art in view of the description of the best presently known mode of carrying out the invention as described herein and as illustrated in the drawings.

DETAILED DESCRIPTION OF THE INVENTION

Figure 1:
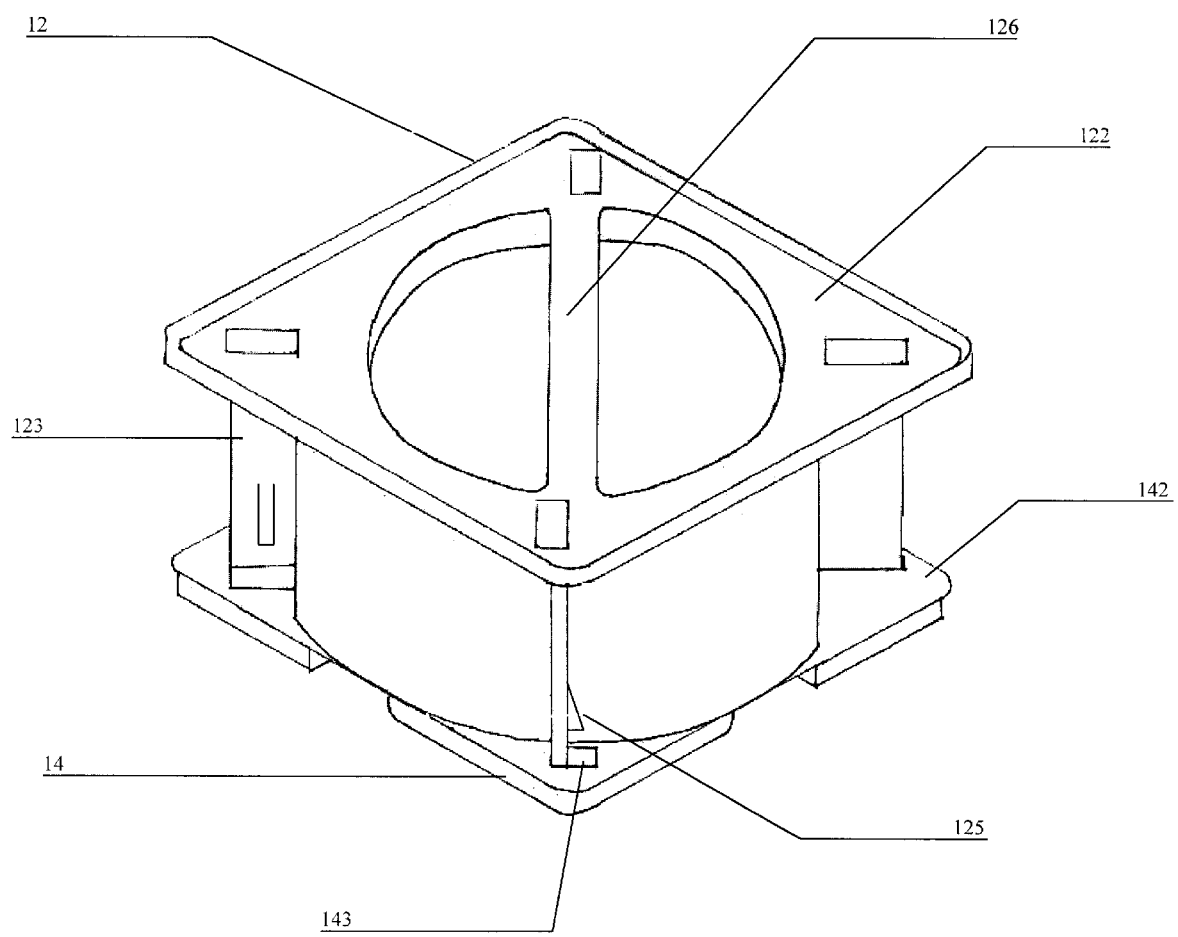
FIG. 1 is a perspective view of the wafer shipping container of the present invention.
Figure 2:
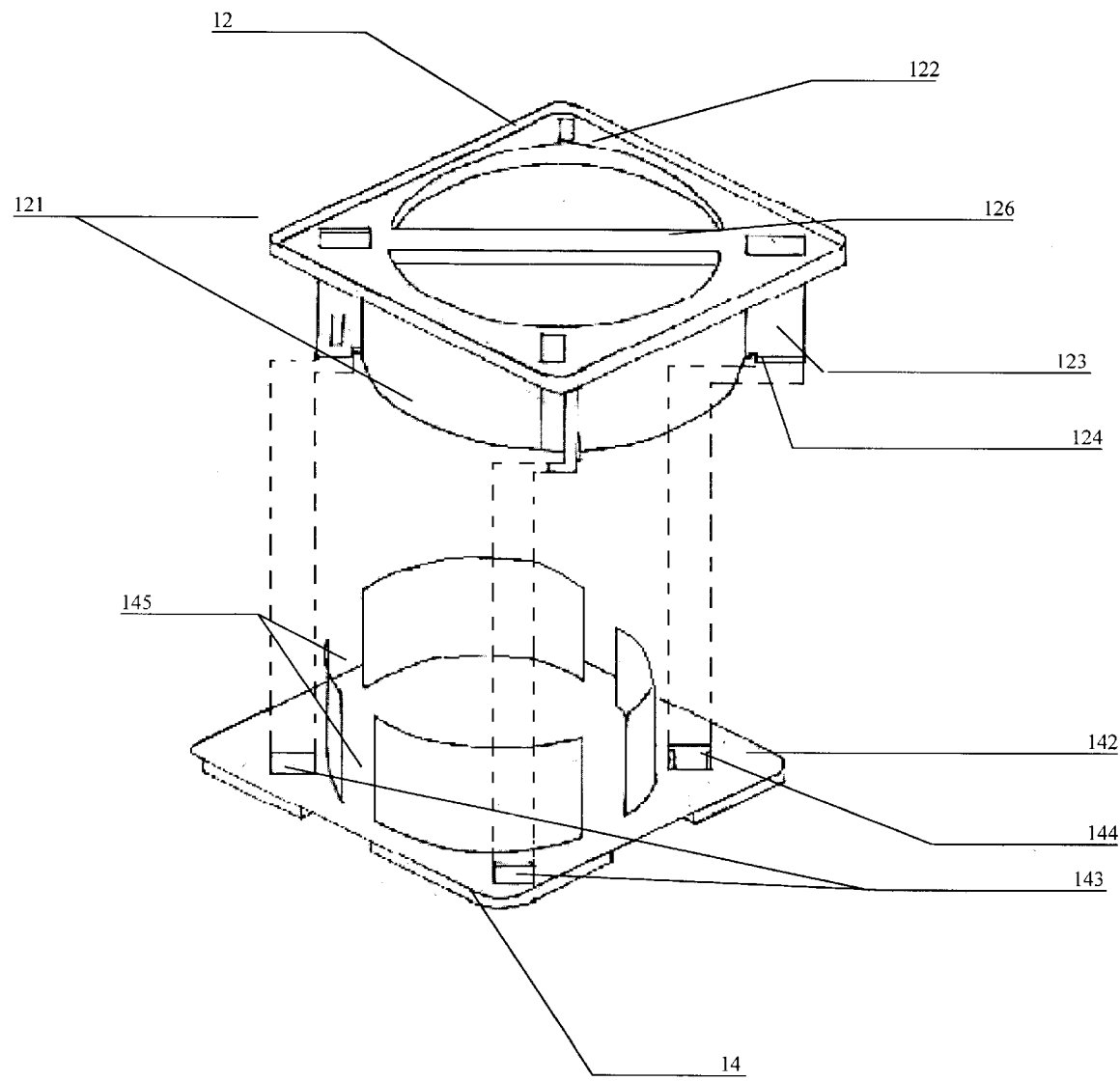
FIG. 2 is a perspective view of the disassembled wafer shipping container.

The present invention is a wafer shipping container 10 that comprises two main body sections, an upper section 12 and a lower section 14. The upper section 12 comprises chiefly an upper cylindrical side wall 121 that is affixed to the underside of a polygonal top plate 122. In the preferred embodiment, the top plate 122 is square with rounded corners. A plurality of connecting ribs 123 extend along the outer surface of the cylindrical side wall 121. While any number of connecting ribs 123 might be employed, in the preferred embodiment, a connecting rib 123 is positioned at each corner of the top plate 122. At the lower end of each connecting rib 123, a securing tab 124 projects from a first side of the connecting rib 123. At a position slightly above the securing tab, and on the opposite side of the connecting rib 123, there is a stop projection 125.

The connecting ribs 123, the securing tabs 124, and the stop projections 125 are elements of the connecting mechanism that secures the upper section 12 to the lower section 14. The function of the connecting mechanism will be described in further detail below.

To aid the user in manipulation of the upper section 12, a top surface of the top plate 122 is equipped with a handle means 126. The handle means 126 enables the user to easily rotate the upper section 12 relative to the lower section 14.

The lower section 14 comprises chiefly a lower cylindrical side wall 141 affixed to the top side of a polygonal bottom plate 142. To correspond to the upper section 12, in the preferred embodiment, the bottom plate 142 is square with rounded corners. A plurality of receiving apertures 143 are located in the bottom plate 142 at locations corresponding to the lower ends of the connecting ribs 123. The receiving apertures 143 must be of sufficient size so that the securing tabs 124 of the connecting ribs 123 can pass through the receiving apertures 143. In at least one of the receiving apertures 143, there is a resilient, flexible locking tab 144. The locking tab 144 is connected to a side of the receiving aperture 143.

So that the container 10 may be easily loaded and unloaded, the lower cylindrical side wall 141 includes at least one vertical open slot 145. The open slots 145 allow the user to reach into the interior of the lower section 14 to easily grasp the wafers being loaded or unloaded. In the preferred embodiment, four open slots 145 are provided.

The lower section 14 is sized so that it nests snugly within the upper section 12 when the two sections are brought together to form the container 12. It should also be readily recognized that the relative positions of the sections 12, 14 could be reversed, and the container 10 would function equally as well. That is, the lower section could be formed so as to include the connecting projections, and the upper section could be constructed with the receiving apertures.

The container 10 is assembled as follows: The upper section 12 is positioned above the lower section 14 so that the connecting ribs 123 align with the receiving apertures 143. The upper section 12 is lowered so that the securing tabs 124 of the connecting ribs pass through the receiving apertures 143. In the receiving aperture 143 that includes the locking tab 144, the locking tab 144 is bent downward to allow the corresponding securing tab 124 to pass through the receiving aperture 143.

The user of the container 10 then utilizes the handle 126 to rotate the upper section 12 relative to the lower section 14 until the connecting ribs 123 contact the sides of the receiving apertures 143 with the securing tabs 124 in contact with the lower surface of the bottom plate 142. When the sections 12, 14 are in this assembled position, with the connecting ribs 123 having passed through the receiving apertures 143, the flexible locking tab 144 returns to a horizontal position. The locking tab 144 contacts the connecting rib 123, thereby inhibiting any reverse rotation of the two sections 12, 14 with respect to each other, so that the sections 12, 14 are locked together to form the wafer shipping container 10. The locking tab 144 is prohibited by the stop projection 125 from releasing the rib 123 if the locking tab 144 is urged upward. This feature is particularly useful in light of the fact that multiple units of the wafer shipping container 10 may be stacked on top of each other.

The wafer shipping container 10 may then be disassembled by simply reversing the assembly process. The user depresses the locking tab 144 until it clears the connecting rib 123, thereby allowing rotation of the upper section 12 with respect to the lower section 14. When the rotation is sufficient for the securing tabs 124 to clear the receiving apertures 143, the upper section 12 can be lifted off the lower section 14.

Wafers are placed in the container 10 as with the current art containers. The wafers are typically separated by protective sheets. Unused space in the container will generally be filled by sponge or foam so that the wafers are held in place without bouncing during transport.

While it is clear that many materials would suffice for the construction of the present invention, it is envisioned that the container sections 12,14 will both typically be formed from molded plastic.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

I claim:

1. A wafer shipping container comprising:

a first section and a second section;

said first section comprises a first cylindrical side wall affixed to an inner side of a first cap plate, a plurality of connecting ribs extending along an outer surface of said first cylindrical side wall, and a securing tab projecting from a first side of a distal end of each said connecting rib, said second section comprises a second cylindrical side wall affixed to an inner side of a second cap plate, a plurality of receiving apertures in said second cap plate at locations corresponding to lower ends of said connecting ribs of said first section, said receiving apertures are large enough so that said securing tabs of said connecting ribs pass through said receiving apertures, and in at least a designated one of said receiving apertures there is a locking tab, said locking tab is connected to a side of said designated receiving aperture; wherein said second section nests within said first section, said connecting ribs being aligned with said receiving apertures so that said securing tabs of said connecting ribs pass through said receiving apertures, said locking tab being bent to allow a corresponding securing tab to pass through said at least one receiving aperture, a user then rotates said first section relative to said second section until said connecting ribs contact sides of said receiving apertures with said securing tabs in contact with an outer surface of said second cap plate, said locking tab then returns to a horizontal position so as to contact a designated connecting rib, thereby inhibiting any reverse rotation of said first and said second sections with respect to each other so that said first and said second sections are locked together to form said wafer shipping container.

2. The wafer shipping container defined in claim 1 wherein:

a stop projection protrudes from a second side of each said connecting rib, said stop projection inhibits movement of said locking tab.

3. The wafer shipping container defined in claim 1 wherein:

an outer surface of one of said cap plates includes a handle means.

4. The wafer shipping container defined in claim 1 wherein:

said second cylindrical side wall includes at least one vertical open slot.

* * * * *